(12) United States Patent
Dixon

(10) Patent No.: US 10,873,340 B2
(45) Date of Patent: Dec. 22, 2020

(54) FEED-FORWARD HIGH RESOLUTION SENSOR MEASUREMENT USING LOW RESOLUTION ADC

(71) Applicant: The Government of the United States of America, as represented by the Secretary of the Navy, Arlington, VA (US)

(72) Inventor: Ray Dixon, Avenue, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/667,409

(22) Filed: Oct. 29, 2019

(65) Prior Publication Data

US 2020/0136634 A1    Apr. 30, 2020

Related U.S. Application Data

(60) Provisional application No. 62/752,012, filed on Oct. 29, 2018.

(51) Int. Cl.
| | |
|---|---|
| *H03M 1/66* | (2006.01) |
| *H03M 1/12* | (2006.01) |
| *H03M 1/68* | (2006.01) |
| *H03M 1/10* | (2006.01) |
| *H03M 1/06* | (2006.01) |
| *H03M 1/00* | (2006.01) |

(52) U.S. Cl.
CPC ............... *H03M 1/12* (2013.01); *H03M 1/68* (2013.01); *H03M 1/00* (2013.01); *H03M 1/06* (2013.01); *H03M 1/1071* (2013.01)

(58) Field of Classification Search
CPC ............ H03M 1/00; H03M 1/12; H03M 1/06; H03M 1/1071
USPC .................................. 341/145, 155, 120, 118
See application file for complete search history.

(56) References Cited

U.S. PATENT DOCUMENTS 6,784,820 B1 * 8/2004 Casalegno ............ H03M 1/181
341/155

* cited by examiner

*Primary Examiner* — Joseph J Lauture
(74) *Attorney, Agent, or Firm* — US Naval Research Laboratory; Richard Bis

(57) ABSTRACT

According to one aspect of the invention, a method for making relatively high resolution measurements using relatively low resolution devices includes the steps of: deriving a first anticipated measurement value; using the first anticipated measurement value as an initial feed-forward signal; comparing the initial feed forward signal to a received signal from a sensor, thereby generating a compared signal; scaling the compared signal to full scale of an analog-to-digital converter, thereby generating a scaled signal; delivering the scaled signal in binary form for computation; and iteratively performing the comparing step until the compared signal is below a predetermined threshold value.

7 Claims, 1 Drawing Sheet

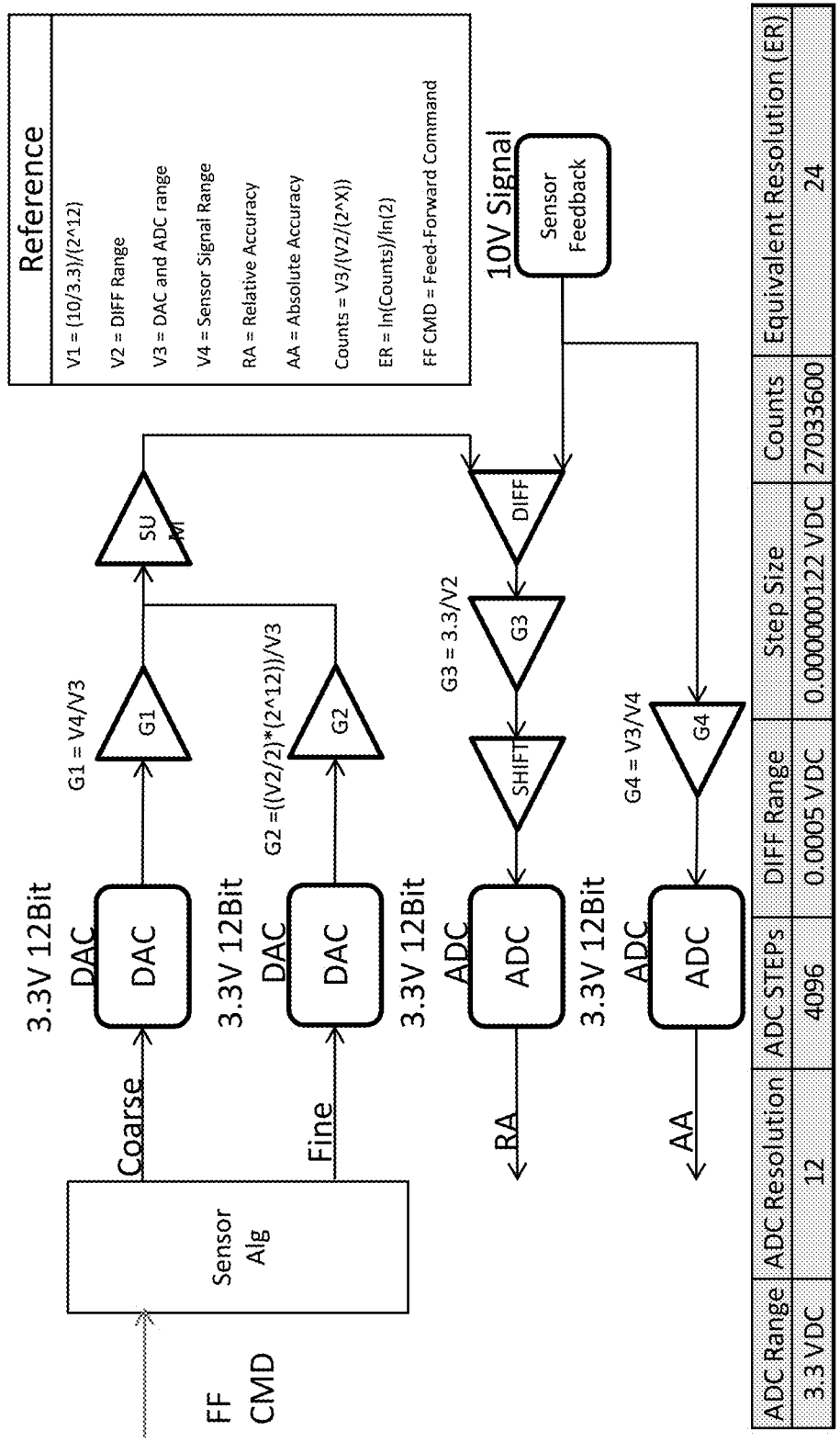

FEED-FORWARD HIGH RESOLUTION SENSOR MEASUREMENT USING LOW RESOLUTION ADC

RELATED APPLICATIONS

This application claims the benefit of U.S. Provisional Application No. 62/752,012 filed Oct. 29, 2018, which is hereby incorporated herein by reference.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing NC 107333.

FIELD OF INVENTION

The present invention relates generally to sensors, and more particularly to high resolution sensing using low resolution devices.

BACKGROUND

Conventional methods for obtaining high resolution measurements using lower resolution devices would be to window the sensor signal, by chopping down the measurement range to increase the effective resolution.

SUMMARY OF INVENTION

The disadvantage to this conventional method is that the overall range would now be limited by windowing. One would then have to make multiple window measurements, along with other logic to accommodate larger ranges.

Using analog-to-digital converters (ADCs) with higher resolution, if obtainable, would provide a solution for increased resolution. This method produces higher material and component cost on the design. The ADC, in some cases creates a higher complexity on the design, due to the features that make the ADC higher resolution.

Therefore, described herein is an alternative solution for measuring sensors when expensive high resolution devices are not available or when windowing down the measurement range is not acceptable. The method described below will provide a path for making high resolution measurement using lower cost and lower resolution parts, but not sacrificing overall measurement range.

According to one aspect of the invention, a method for making relatively high resolution measurements using relatively low resolution devices includes the steps of: deriving a first anticipated measurement value; using the first anticipated measurement value as an initial feed-forward signal; comparing the initial feed forward signal to a received signal from a sensor, thereby generating a compared signal; scaling the compared signal to full scale of an analog-to-digital converter, thereby generating a scaled signal; delivering the scaled signal in binary form for computation; and iteratively performing the comparing step until the compared signal is below a predetermined threshold value.

Optionally, the step of deriving a first anticipated measurement value includes obtaining an absolute accuracy measurement and operational characteristics of the sensor.

Optionally, the step of using the first anticipated measurement value includes two digital-to-analog converters (DACs) driving a "Coarse" and "Fine" signal into a summing amplifier.

Optionally, the method includes shifting the scaled signal.

Optionally, the feed-forward signal is derived in a processor

Optionally, the feed-forward signal is derived in a field-programmable gate array (FPGA).

Optionally, the "Coarse" signal is preferably scaled to the full range of a sensor feedback output signal.

The foregoing and other features of the invention are hereinafter described in greater detail with reference to the accompanying drawings.

BRIEF DESCRIPTION OF THE DRAWINGS

FIG. 1 shows an exemplary embodiment of the subject invention.

DETAILED DESCRIPTION

Feed-Forward High Resolution Measurement is a way to measure very fine value by anticipating what the value should be, then measuring the difference. Complete characterization and understanding of sensor behavior is needed to develop a sensor model to generate the best Feed-Forward signal. Through this method, the feed-forward signal can be set extremely close to the actual output of the sensor. This allows for a very small delta measurement to be made. By windowing down the possible measurement range, the magnitude of the measurement decreases by the Window range/ENOB and in turn increases the overall resolution. Ideally, the design will be able to gain infinite resolution with knowledge of the sensor output. Of course, infinite resolution is not possible since a noise component will be involved in the measurement and will eventually saturate the measurement as smaller and smaller resolution is attempted. This application is more suited to achieving high resolution from a relative accuracy position.

Referring to FIG. 1, having the Absolute Accuracy (AA) measurement will provide a gross value for the sensor's output. This value, used with the knowledge of the sensors behavior, is used to derive the first anticipated values, which is used as the Feed-Forward (FF) signal. The high resolution measurement is achieved by inputting a signal into the circuit at the anticipated value of the sensor output. This is represented by the two digital-to-analog converters (DACs) driving a "Coarse" and "Fine" signal into a summing amplifier. This signal is then fed into a difference amplifier which is also receiving a signal from the sensor. This signal is compared, gained to the full scale of the ADC, and shifted. Depending on the ADC chosen, the level shift may not be necessary. This signal is then delivered in a binary form for computation. The comparison step should be run until the value is as close to zero as desired, by incrementing the "Coarse" and "Fine" value.

If an AA measurement is not available the high resolution measurement can be obtained by adjusting the FF signal until the output of the Relative Accuracy (RA) signal is as close to zero as possible. This would mean that the FF signal used is effectively the signal being measured from the sensor (within the resolution of the parts selected).

It is noted that the Feed-Forward signal is preferably derived in a processor or FPGA. The processor or FPGA will preferably include the logic to perform comparisons to obtain the high resolution measurement.

The "Coarse" signal is preferably scaled to the full range of the sensor feedback output signal. The "Fine" measurement may only be utilized if the step size of the "Coarse" signal is not within the DIFF Range (V2). This allows the Feed-Forward signal to be set within the measurement range for the high resolution measurement. The "Coarse" and "Fine" inputs are preferably summed as seen in Example Block Diagram in FIG. 1. The DIFF Range (V2) is driven by the required resolution. This value is used to determine the Gain (G3) needed to get the signal in the correct range for an ADC. This ultimately resulting in the Relative Accuracy (RA) Measurement in the exemplary block diagram.

Absolute Accuracy (AA) measurement is needed to give absolute knowledge of the Sensor, but is not required for all applications. The Gain (G4) for this measurement is dependent upon the full scale of the sensor output signal and the ADC range.

Although the invention is described and shown herein with reference to a single embodiment using 12 bit ADCs in combination with 12 bit DACs to drive the Feed-Forward signal, there are many different combinations of ADCs and DACs that could be used to obtain a desired resolution measurement. The application and use of this will depend on the sensor being measured, and the application is scalable. Other exemplary feed forward methods can use single or multiple ADCs and DACs, sized for the desired resolution.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method for making relatively high resolution measurements using relatively low resolution devices, the method including the steps of:
    deriving a first anticipated measurement value;
    using the first anticipated measurement value as an initial feed-forward signal;
    comparing the initial feed forward signal to a received signal from a sensor, thereby generating a compared signal;
    scaling the compared signal to full scale of an analog-to-digital converter, thereby generating a scaled signal;
    delivering the scaled signal in binary form for computation; and
    iteratively performing the comparing step until the compared signal is below a predetermined threshold value.

2. The method of claim 1, wherein the step of deriving a first anticipated measurement value includes obtaining an absolute accuracy measurement and operational characteristics of the sensor.

3. The method of claim 1, wherein the step of using the first anticipated measurement value includes two digital-to-analog converters (DACs) driving a "Coarse" and "Fine" signal into a summing amplifier.

4. The method of claim 3, wherein the "Coarse" signal is preferably scaled to the full range of a sensor feedback output signal.

5. The method of claim 1, further comprising:
    shifting the scaled signal.

6. The method of claim 1, wherein the feed-forward signal is derived in a processor.

7. The method of claim 1, wherein the feed-forward signal is derived in a field-programmable gate array (FPGA).

* * * * *